United States Patent
Pak et al.

(10) Patent No.: US 7,028,069 B1
(45) Date of Patent: Apr. 11, 2006

(54) DYNAMIC CIRCUIT USING EXCLUSIVE STATES

(75) Inventors: Edward T. Pak, Saratoga, CA (US); Sivakumar Doraiswamy, Sunnyvale, CA (US)

(73) Assignee: Raza Microelectronics Inc., Cupertino, CA (US)

( * ) Notice: Subject to any disclaimer, the term of this patent is extended or adjusted under 35 U.S.C. 154(b) by 568 days.

(21) Appl. No.: 09/996,865

(22) Filed: Nov. 27, 2001

Related U.S. Application Data

(60) Continuation-in-part of application No. 09/970,250, filed on Oct. 3, 2001, now abandoned, which is a division of application No. 09/562,063, filed on May 1, 2000.

(51) Int. Cl.
*G06F 7/50* (2006.01)
(52) U.S. Cl. .................................... 708/710; 708/711
(58) Field of Classification Search ............... 708/700, 708/702, 703, 704, 706, 710, 711, 712, 713, 708/714; 326/98, 51
See application file for complete search history.

(56) References Cited

U.S. PATENT DOCUMENTS

| | | | | | |
|---|---|---|---|---|---|
| 4,962,471 | A | * | 10/1990 | Cornelissen | 708/711 |
| 5,208,490 | A | * | 5/1993 | Yetter | 326/98 |
| 5,600,583 | A | * | 2/1997 | Bosshart et al. | 708/525 |
| 5,719,803 | A | * | 2/1998 | Naffziger | 708/710 |
| 6,144,228 | A | * | 11/2000 | Matson et al. | 326/121 |
| 6,175,852 | B1 | * | 1/2001 | Dhong et al. | 708/712 |
| 6,329,857 | B1 | * | 12/2001 | Fletcher | 327/215 |
| 6,496,846 | B1 | * | 12/2002 | Bradley | 708/710 |

\* cited by examiner

*Primary Examiner*—Chuong D. Ngo
(74) *Attorney, Agent, or Firm*—IP Strategy Group PC

(57) ABSTRACT

The invention provides a dynamic domino circuit that is robust under noisy condition. The invention also provides a dynamic adder that contains nodes that can produce true dynamic inversion without compromising area or speed. The invention further improves speed of the adders by cutting the latch delay while not requiring complex clocking.

6 Claims, 3 Drawing Sheets

US 7,028,069 B1

DYNAMIC CIRCUIT USING EXCLUSIVE STATES

RELATED U.S. APPLICATION DATA

This application is a Continuation-in-Part of U.S. patent application Ser. No. 09/970,250, entitled "Dynamic Circuits Using Exclusive States" by Pak, et al., filed on Oct. 4, 2001.

FIELD OF THE INVENTION

The invention relates to dynamic circuits.

BACKGROUND

Dynamic circuits are not robust under noisy condition. For example, a typical dynamic domino circuit uses a half or full latch to hold its dynamic nodes. However, under noisy conditions, these nodes can couple to noise and lose their data. Thus, a need exists for a dynamic domino circuit that is robust under noisy condition.

As another example, in many kinds of dynamic adders, inversion of carry that is required at the end of the carry chain is either accomplished by using a static inverter (extra gate delay) followed by static circuits, or having a separate chain of logic to generate carry bar (area penalty). For a really fast implementation, four chains of logic (g, ~g, p, ~p) are needed, thereby consuming a lot of area. Thus, a need exists for a dynamic adder that does not use a static inverter that causes extra gate delay A further need exists for a dynamic adder that does not consume a lot of area.

Furthermore, in most dynamic adders, a latch is required at the output to preserve the generated sum during circuit precharge. A need exists to improve the speed of the adders by cutting the latch delay while not requiring complex clocking.

SUMMARY

The invention provides a dynamic domino circuit that is robust under noisy condition. The invention provides a dynamic adder that does not use a static inverter that causes extra gate delay. The invention also provides a dynamic adder that does not consume a lot of area. The invention also improves speed of the adders by cutting the latch delay while not requiring complex clocking.

Preferably, a dynamic circuit includes a logic portion and three dynamic output portions, each of which having a dynamic node for holding data. A first and a second transistors have their gates coupled to the first dynamic node. The first transistor has its drain coupled to the second dynamic node, and the second transistor has its drain coupled to the third dynamic node. A third and a fourth transistors have their gates coupled to the second dynamic node. The third transistor has its drain coupled to the first dynamic node, and the fourth transistor has its drain coupled to the third dynamic node. A fifth and a sixth transistors having their gates coupled to the third dynamic node. The fifth transistor has its drain coupled to the first dynamic node, and the sixth transistor has its drain coupled to the second dynamic node.

DETAILED DESCRIPTION

Reference is made in detail to the preferred embodiments of the invention. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1:
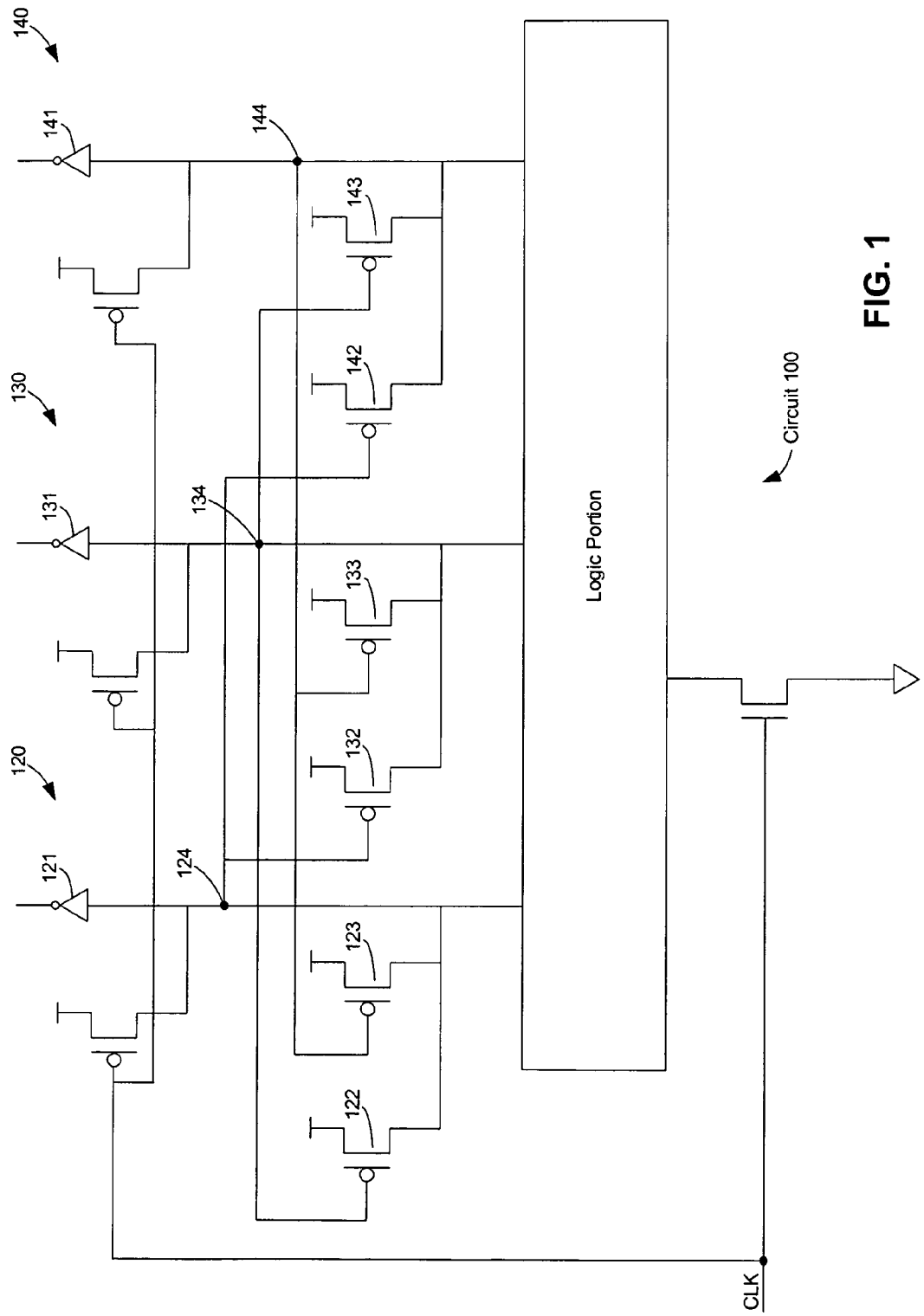
FIG. 1 shows a dynamic domino circuit in accordance with one embodiment of the invention.

Referring now to FIG. 1, a dynamic domino circuit 100 is shown in accordance with one embodiment of the invention. Circuit 100 comprises of a logic portion 10 coupled to three dynamic output portions 120, 130 and 140. Dynamic output portion 120 is used for holding data for the propagate signal (p). Dynamic output portion 130 is used for holding data for the generate signal (g). Dynamic output portion 140 is used for holding data for the kill signal (k).

Referring still to FIG. 1, dynamic output portion 120 comprises an inverter 121, transistors 122 and 123, and dynamic node 124. Dynamic output portion 130 comprises an inverter 131, transistors 132 and 133, and dynamic node 134. Dynamic output portion 140 comprises an inverter 141, transistors 142 and 143, and dynamic node 144.

Transistors 132 and 142 are coupled to dynamic node 124. Transistors 122 and 143 are coupled to dynamic node 134. Transistor 123 and 133 are coupled to dynamic node 144. Assume dynamic nodes 124, 134 and 144 are mutually exclusive. That is to say, one and only one dynamic node among nodes 124, 134 and 144 will be at logic zero when the clock is high. As such, when dynamic node 124 holds a logic zero, dynamic node 134 holds a logic one and dynamic node 144 holds a logic one. Similarly, when dynamic node 134 holds a logic zero, dynamic node 124 holds a logic one and dynamic node 144 holds a logic one. Also similarly, when dynamic node 144 holds a logic zero, dynamic node 124 holds a logic one and dynamic node 134 holds a one.

This exclusive property can be used to ensure that the dynamic nodes 124, 134 and 144 will recover fully from noise. Specifically, as an example, a logic zero being held on dynamic node 124 turns on transistor 132 to provide a current to ensure that a logic one is held in dynamic node 134. As such, if a noise spike occurs at dynamic node 134 to change the logic one held therein into a logic zero, the current supplied by transistor 132 recovers the logic one at dynamic node 134. Also, a logic zero being held on dynamic node 124 turns on transistor 142 to provide a current to ensure that a logic one is held in dynamic node 144. As such, if a noise spike occurs at dynamic node 144 to change the logic one held therein into a logic zero, the current supplied by transistor 142 recovers the logic one at dynamic node 144. As understood herein, the idea of noise recoverability applies not only to circuit 100, but to any class of dynamic circuit that uses exclusive signals.

Continuing with FIG. 1, the same theory holds when node 134 is being held at logic zero and nodes 124 and 134 are being held at logic one. The same theory also holds when node 144 is being held at logic zero and nodes 124 and 134 are being held at logic one.

Figure 2:
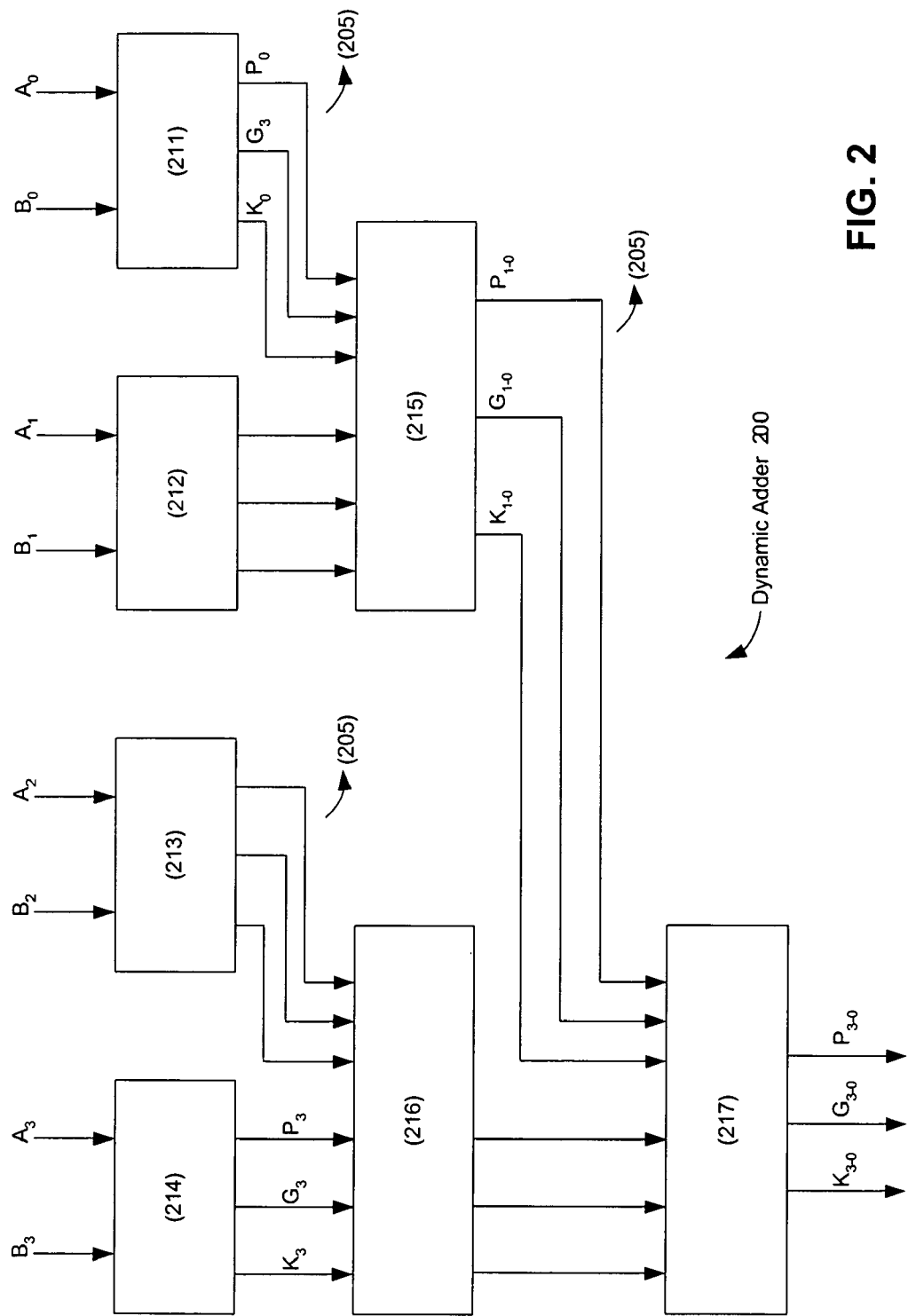
FIG. 2 shows a dynamic adder in accordance with one embodiment of the invention.

Referring now to FIG. 2, a portion of a carry chain 205 of a dynamic adder 200 is shown in accordance with one embodiment of the invention. Each of dynamic circuits 211–217 is used to generate successive levels of propagate (p), generate (g), and kill (k) signals. Each set of p, g, and k at each level is mutually exclusive. True dynamic inversion at any point in carry chain 205 can be achieved as a simple function of true terms.

In one embodiment of the invention, the terms k, p, g can be defined as:

k (carry out termination/kill)=>~A & ~B
p (carry out propagation)=>A^B or A+B
g (carry out generation)=>A & B where A and B are inputs such as $A_0$, $B_0$, $A_1$, $B_1$, $A_2$, $B_2$, $A_3$, $B_3$, as referenced in FIG. 2.

As an example, referring still to FIG. 2, consider nodes k0, g0, and p0 as shown. Inversion of each of these nodes can be implemented in the form of the following simple equations:

$$\sim p0 = g0 + k0,$$

$$\sim g0 = p0 + k0, \text{ and}$$

$$\sim k0 = g0 + p0,$$

Similar equations apply for inversion at all other levels of carry chain 205.

Additionally, the terms k, p, g can be defined in groups as follows:

$$gk(i:0) = k(i) + p(i) \& gk(i-1:0)$$

$$gp(i:0) = p(i) \& gp(i-1:0)$$

$$gg(i:0) = g(i) + p(i) \& gg(i-1:0)$$

For example, when i=1, gk, gg, gp corresponds to $gk_{1:0}$, $gg_{1:0}$, $gp_{1:0}$, as referenced in FIG. 2.

Also, for i>j>k, $$gk(i:k) = gk(i:j) + gp(i:j) + gk(j-1:k)$$

$$gp(i:k) = gp(i:j) + gp(j-1:0)$$

$$gg(i:k) = gg(i:j) + gp(i:j) + gg(j-1:k)$$

Group level inversions can be accomplished as a function of true terms as follows:

$$\sim gk(i:k) = gp(i:k) + gg(i:k)$$

$$\sim gp(i:k) = gg(i:k) + gk(i:k)$$

$$\sim gg(i:k) = gp(i:k) + gk(i:k)$$

In this embodiment, the terms k, p, g are mutually exclusive and the terms gk, gp, gg are mutually exclusive. By using exclusivity nature of the terms k/p/g and gk/gp/gg, inversion of signals can be expressed in terms of monotonic signals.

By using true terms to generate complements, a common problem in dynamic signal inversion is circumvented. In a regular dynamic circuit, inversion is frequently implemented by demorganization all the way to the beginning of carry chain 205. In so doing, four terms (generate (g), generate bar (~g), propagate (p), and propagate bar (~p)) are required per dynamic circuit. On the other hand, by using only three terms rather than the conventional four terms, more area can be saved.

Figure 3A:
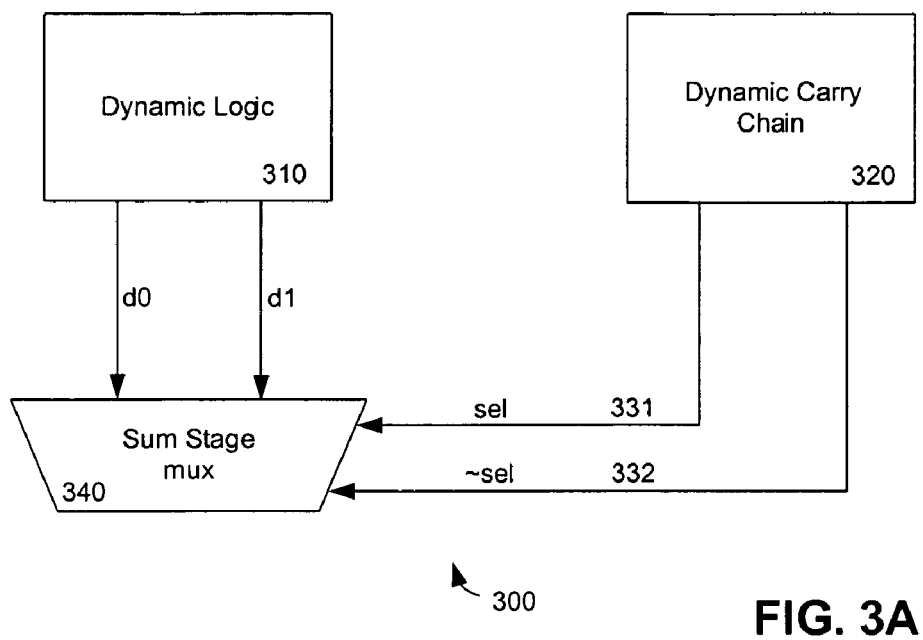
FIG. 3A shows a multiplexer implementing dynamic select inputs in accordance with one embodiment of the invention.

Referring now to FIG. 3A, a final stage of a dynamic adder 300 is shown in accordance with one embodiment of the invention. A sum stage mux circuit 340 is coupled to a dynamic logic 310 and a dynamic carry chain 320. A latch 350 is built into mux circuit 340 such that no additional delay is introduced in the critical path of adder 300. Controlling inputs sel 331 and ~sel 332 are used both as selection signals for mux circuit 340 and also as a clock for latch 350.

Figure 3B:
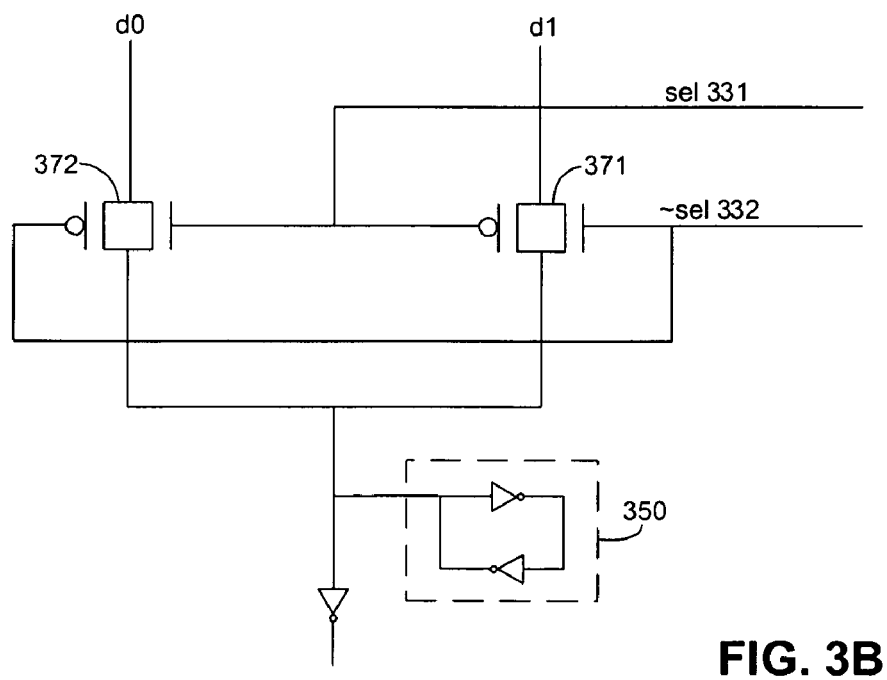
FIG. 3B shows a blow up view of the multiplexer from FIG. 3A.

Referring now to FIG. 3B, a detailed diagram of mux circuit 340 is shown in accordance with one embodiment of the invention. As shown, mux circuit 340 includes latch 350 coupled to input d0 361, input d1 362, sel 331 and ~sel 332. When the clock is high, dynamic nodes sel 331 and ~sel 332 evaluate to their respective logic, thereby functioning as select inputs to mux circuit 340. When the clock is low, sel 331 and ~sel 332 precharge to logic zero, thereby cutting off transmission gates 371 and 372. In turn, latch 350 will hold the state of mux circuit 340 for the remainder of the clock cycle. As such, a latch has been implemented with neither additional delay nor any complex clocking.

What is claimed is:

1. A dynamic adder comprising:
a plurality of dynamic domino circuits arranged into a plurality of stages, wherein each of said plurality of dynamic domino comprising:
a logic portion adapted for processing logic of said dynamic domino circuit,
a first dynamic output portion coupled to said logic portion, said first dynamic output portion having a first dynamic node for dynamically holding a first data,
a second dynamic output portion coupled to said logic portion, said second dynamic output portion having a second dynamic node for dynamically holding a second data,
a third dynamic output portion coupled to said logic portion, said third dynamic output portion having a third dynamic node for dynamically holding a third data,
a first and a second transistors having their gates coupled to said first dynamic node, said first transistor having its drain coupled to said second dynamic node, said second transistor having its drain coupled to said third dynamic node,
a third and a fourth transistors having their gates coupled to said second dynamic node, said third transistor having its drain coupled to said first dynamic node, said fourth transistor having its drain coupled to said third dynamic node, and
a fifth and a sixth transistors having their gates coupled to said third dynamic node said fifth transistor having its drain coupled to said first dynamic node, said sixth transistor having its drain coupled to said second dynamic node; and a multiplexer coupled to a final stage comprising:
        a latch built into said multiplexer, and
        a first and a second dynamic select inputs to said multiplexer, wherein said multiplexer functions as a latch using said latch when said first and said second dynamic select inputs are precharged to logic zero, and wherein said multiplexer functions as a multiplexer when said first and said second select inputs are evaluated to their respective logic values.

2. A dynamic adder to generate dynamic logic inversions comprising:
    a plurality of dynamic domino circuits arranged into a plurality of stages, wherein at least one stage comprising a dynamic circuit implementing a mutually exclusive circuit to compute groups of three terms carry logic, wherein the value of each of the three terms carry logic is represented as a dynamic output computed as a function of true terms;
    wherein the mutually exclusive circuit includes three dynamic output portions representing one for each of the three terms carry logic where each dynamic output portion is coupled to gates of transistors whose drains are coupled to the other dynamic output portions such that the output of a selected dynamic output portion is exclusive of the values of the other dynamic output portions, and wherein groups of said three terms carry logic comprises group propagate (gp), group generate (gg), and group kill (gk), and
    a multiplexer coupled to a final stage comprising:
        a latch built into said multiplexer, and
        a first and a second dynamic select inputs to said multiplexer, wherein said multiplexer functions as a latch using said latch when said first and said second dynamic select inputs are precharged to logic zero, and wherein said multiplexer functions as a multiplexer when said first and said second select inputs are evaluated to their respective logic values.

3. The dynamic adder of claim 2, wherein the groups of said three terms carry logic are mutually exclusive.

4. The dynamic adder of claim 3, wherein the inversion is implemented by $(\sim gk) = (gp) + (gg)$.

5. The dynamic adder of claim 3, wherein the inversion is implemented by $(\sim gp) = (gg) + (gk)$.

6. The dynamic adder of claim 3, wherein the inversion is implemented by $(\sim gg) = (gp) + (gk)$.

* * * * *